United States Patent [19]
Iuchi

[11] Patent Number: 5,843,797
[45] Date of Patent: Dec. 1, 1998

[54] METHOD OF REDUCING OFFSET FOR ION-IMPLANTATION IN SEMICONDUCTOR DEVICES

[75] Inventor: Makoto Iuchi, Tokyo, Japan

[73] Assignee: NEC Corporation, Tokyo, Japan

[21] Appl. No.: 617,112

[22] Filed: Mar. 18, 1996

[30] Foreign Application Priority Data

Mar. 17, 1995 [JP] Japan .................................. 7-057851

[51] Int. Cl.[6] ................................................ H01L 21/266
[52] U.S. Cl. ................................ 437/45; 437/48; 437/924
[58] Field of Search ................................ 437/35, 45, 48, 437/229, 924; 148/DIG. 102

[56] References Cited

U.S. PATENT DOCUMENTS

| | | | |
|---|---|---|---|
| 4,910,162 | 3/1990 | Yasaka et al. | 437/48 |
| 5,350,703 | 9/1994 | Lee | 437/48 |
| 5,372,961 | 12/1994 | Noda | 437/45 |

OTHER PUBLICATIONS

"Mask ROM, Reduction in delivery time to half by writing data after formation of interconnections", Nikkei Microdevices, Dec., 1991, pp. 104–109.

Primary Examiner—Chandra Chaudhari
Attorney, Agent, or Firm—Foley & Lardner

[57] ABSTRACT

Programming of a plurality of mask ROMs having a common structure and formed on a semiconductor wafer is effected by an ion implantation for adjusting the threshold voltage of the memory transistors. The mask ROMs on the wafer is grouped in a plurality of groups arranged in point-symmetry or axisymmetry. During forming a photoresist pattern for each of the mask ROMs, a common alignment offset is assigned to the photoresist patterns of the mask ROMs in each group in the location of opening for ion implantation. Ion implantation is effected to the mask ROMs by using the photoresist patterns having respective alignment offsets in openings. During the ion implantation, the difference in incident angle of an ion beam between the positions on the wafer is compensated by the alignment offsets in the opening of the photoresist patterns.

7 Claims, 9 Drawing Sheets

| GROUP | OFFSET (ΔL)[μm] | |
|---|---|---|
| | X | Y |
| A | 0 | 0 |
| B | +0.13 | 0 |
| C | −0.13 | 0 |
| D | 0 | +0.13 |
| E | 0 | −0.13 |
| F | +0.13 | +0.13 |
| G | −0.13 | +0.13 |
| H | +0.13 | −0.13 |
| I | −0.13 | −0.13 |

| GROUP | OFFSET ($\Delta L$)[$\mu$m] | |
|---|---|---|
| | X | Y |
| J | 0 | 0 |
| K | +0.08 | 0 |
| L | -0.08 | 0 |

METHOD OF REDUCING OFFSET FOR ION-IMPLANTATION IN SEMICONDUCTOR DEVICES

BACKGROUND OF THE INVENTION (a) Field of the Invention

The present invention relates to a method for an ion-implantation and, more particularly, to a method for ion-implantation suited for programming a mask ROM and capable of reducing offset or deviation generated in the ion-implantation.

(b) Description of the Related Art

In insulated gate field effect transistors (referred to as FETs, hereinafter), especially of a mask ROM (read-only memory), ion implantation technique is used to implant impurity ions into the channel region thereof, to thereby control or adjust the threshold voltage of the FETs. The control of the threshold voltage in a mask ROM is also used for programming of the mask ROM to write read-only data therein.

A conventional method for programming a mask ROM will be described with reference to drawings.

Figure 1:
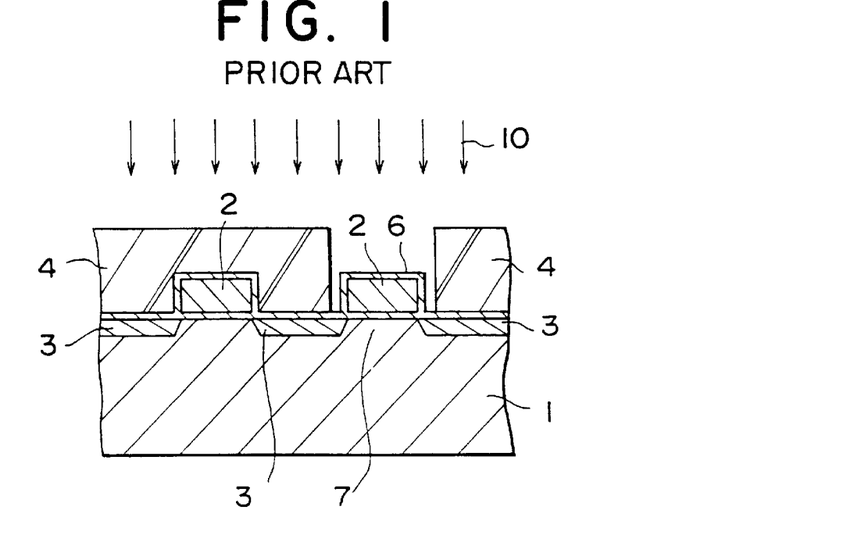
FIG. 1 is a cross-sectional view of a semiconductor device during an ion implantation step of a conventional method.

FIG. 1 shows a partial cross-section of a mask ROM during the conventional process for programming. The memory cells depicted in the drawing are implemented by n-channel MOS transistors. Gate electrodes 2 covered by silicon oxide films 6 have been formed on a semiconductor substrate 1. The step of diffusing impurity ions into source/drain regions 3 has also been completed. For programming of the memory transistors, a photoresist pattern 4 is formed on the entire surface by a photolithographic technique, the photoresist pattern having an opening for each of the FETs through which an ON data is to be written.

Phosphorous ions ($^{31}P^+$) 10 are then implanted into channel regions of the FETs for programming the same by using the photoresist pattern 4 as a mask at an acceleration energy of 200–300 keV and a dosage of $1\times10^{13}$–$5\times10^{13}$ ions/cm$^2$, for example. A FET having a channel region 7 implanted with phosphorous ions enters a normally ON state, thereby storing data "1" therein.

Of innovative ion implanters, those capable of implanting ions having high acceleration energy levels have been marketed recently. The so-called high-energy ion implanter reduces intervals between the time of obtaining from a customer the data to be written for a mask ROM and the time of delivery of the products of the mask ROM.

Figure 2:
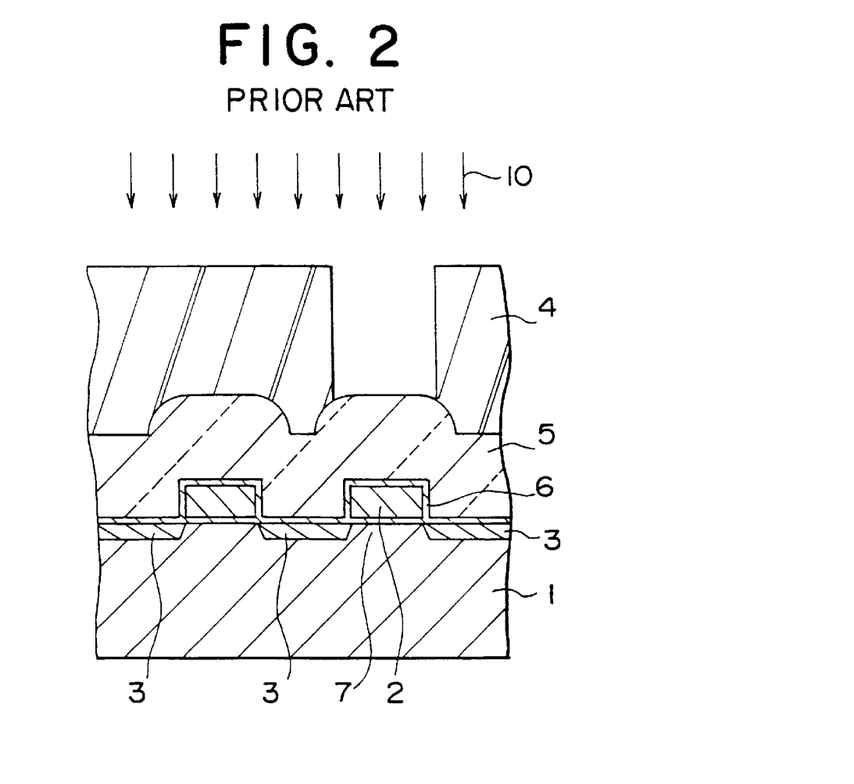
FIG. 2 is a cross-sectional view of a semiconductor device during an ion implantation step of another conventional method.

FIG. 2 shows a partial cross-section of a mask ROM in the process of programming by a conventional method using the high-energy ion implantation technique. The use of the high-energy ion implantation technique increases an average injection range of implanted ions. Hence, as shown in FIG. 2, it is possible to implant ions into the mask ROM from above the interlayer insulating film 5 after contacts are formed therein. That is, the interlayer insulating film 5 can be formed before programming of the mask ROM which is effected after the data are obtained from the customer.

Specifically, phosphorous ions ($^{31}P^+$) are implanted from above the interlayer insulating film 5 for programming the FET at an acceleration energy of 800–1000 keV and a dosage of $1\times10^{13}$–$5\times10^{13}$ ions/cm$^2$. After the step of programming, aluminum interconnects are formed, then a protective insulating film is formed thereon, thus making the product ready for delivery.

The conventional method as described above is used for forming an NAND mask ROM by implanting ions of a V-group element. On the other hand, Nikkei Microdevice, December, 1991, pp. 104–109, discloses a process using the high-energy ion implantation technique wherein ions of a III-group element, such as boron ions ($^{11}B^+$), are implanted to make the selected transistors in a normally OFF state for programming, thereby reducing the time period for programming.

In general, available ion implanters are classified into three categories as to methods for scanning ion beams.

The first category is a so-called raster scanning ion implanter, in which horizontal and vertical pairs of scanning electrodes deflect an ion beam emitted from an acceleration tube to scan a single semiconductor wafer held by a wafer holder. In this type, the ion beam impinges perpendicularly to the main surface of the semiconductor wafer at the central portion thereof while the ion beam impinges on the semiconductor wafer 2° or 3° deflected from the perpendicular of the main surface at the peripheral portion thereof, with the center of the wafer being the axis of a point-symmetry. If the ion implanter uses a spherical holding plate for improving cooling efficiency during the implantation, the peripheral portion of the wafer usually deflects in accordance with the configuration of the holding plate, so that the injection angle at the peripheral portion further increases up to about 4° or 5°.

The second category is a so-called disc scanning ion implanter, in which an ion beam is fixed while a plurality of (typically 10 or more) semiconductor wafers are held for rotation by a holder disc to align on a circle so as to effect relative scanning of an ion beam effected by rotation of the holder disc. The holder disc secures the semiconductor wafers against the centrifugal force derived from the rotation of the disc, so that the holder disc is configured such that the perpendicular of the disc surface is inclined from the direction of the ion beam toward the center of the holder disc by an angle of 5°–10° for facilitating the fixing. The rotational axis of the disc is inclined so that the surface of the uppermost wafer has a vertical posture during ion implantation of the same. In this configuration, however, the ion beam impinges perpendicularly on the uppermost semiconductor device at the central portion thereof, while the ion beam impinges on the peripheral portion of the same semiconductor device at an incident angle of 2°–3° inclined in rotational direction of the holder disc.

The third category is a so-called parallel scanning ion beam implanter, in which an auxiliary electrode is additional provided in the raster scanning ion implanter of the first category ahead the scanning electrodes. This allows the ion beam to impinge perpendicularly on the surface of a semiconductor wafer irrespective of portions of the wafer which are being scanned. This type of ion implanter is not popular because of a larger size and higher price as compared to those of the raster scanning ion implanter.

High-energy ion implanters available at present are the raster scanning ion implanter of the first category and the disc scanning ion implanter of the second category. In either type, the ion beam does not impinge perpendicularly on a semiconductor wafer at the peripheral portion thereof. If a programming for a mask ROM is performed using these types of ion implanters, the following problems will arise.

Figure 3:
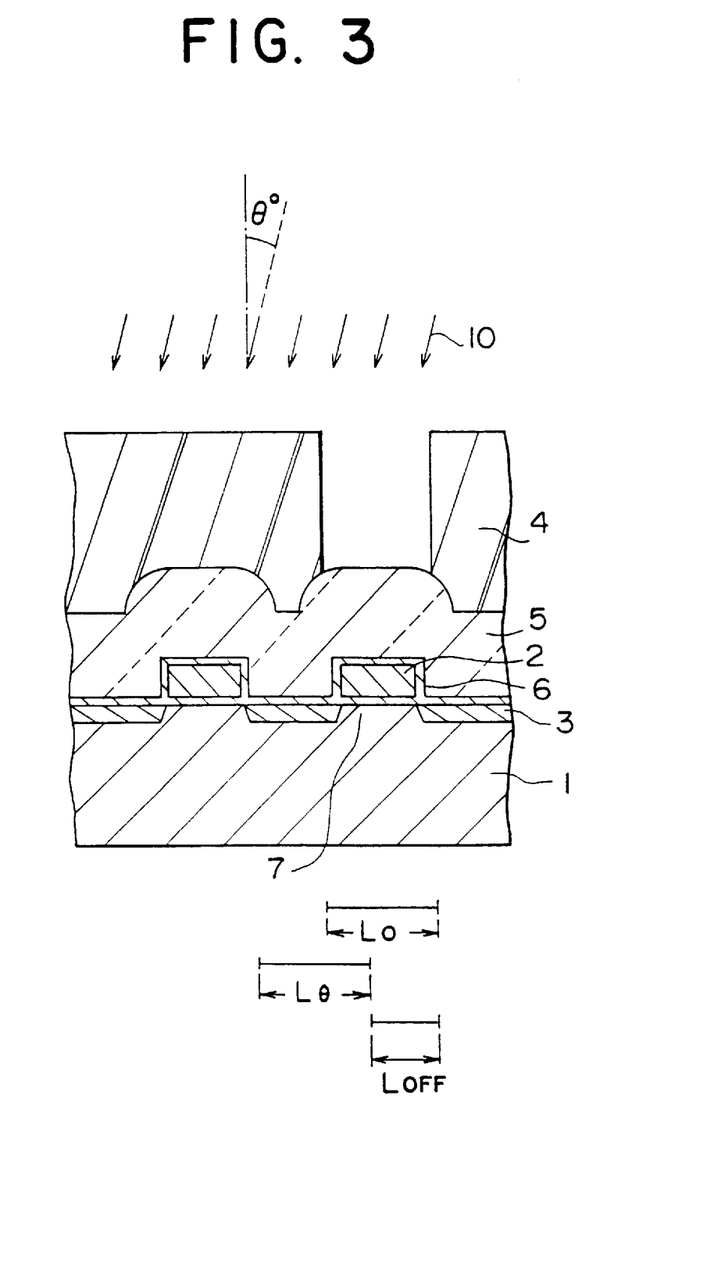
FIG. 3 is a cross-sectional view of a semiconductor device for illustrating a problem involved in the another conventional method of FIG. 2.

FIG. 3 shows a partial cross-section of a semiconductor device during programming by a high-energy implantation technology when the ion beam is injected at an angle deviated from 90°. During the programming, phosphorous ions ($^{31}P^+$), for example, are implanted at an acceleration energy of 800–1000 keV by using 2 $\mu$m thick photoresist 4 as a mask. If the ions 10 injected in the peripheral portion of the semiconductor wafer have an injection angle θ with respect to the perpendicular of the wafer surface, ions will be implanted at a region $L_θ$ which is offset from a gate region or a designed region $L_o$ by an offset amount $L_{off}$. Assuming that ions are implanted into a semiconductor wafer having a 6-inch diameter, a photoresist mask has a thickness of 2 μm, an interlayer insulating film 5 has a thickness of 1 μm, and the injection angle is 5° at the peripheral portion of the semiconductor wafer, an offset $L_{off}$ of about 0.26 μm will be generated.

In the case as mentioned above, a first problem is that the FET to be programmed will not be made normally ON because ions for controlling the threshold voltage are not implanted in the channel region. A second problem is that phosphorous ions for programming are implanted into a region other than the channel region. For example, if phosphorous ions are implanted into source/drain regions to raise the impurity concentration therein, it will result in an increased reverse leakage current through the $N^+/P$ junction. Otherwise, if phosphorous ions are implanted beneath the field oxide film, it will result in a reduced withstand voltage to thereby degrade the reliability of the FET.

Figure 4A:
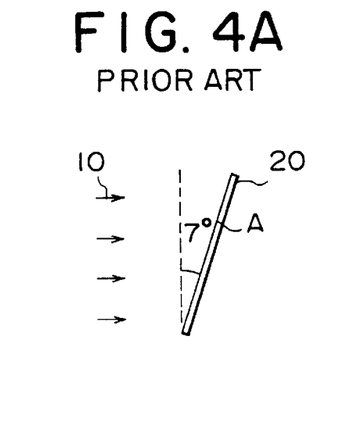
FIGS. 4A to 4F are explanatory views including side views, front views and cross-sectional views of a semiconductor wafer during a proposed conventional method.
Figure 4B:
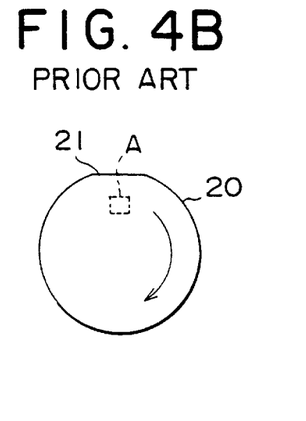
Figure 4C:
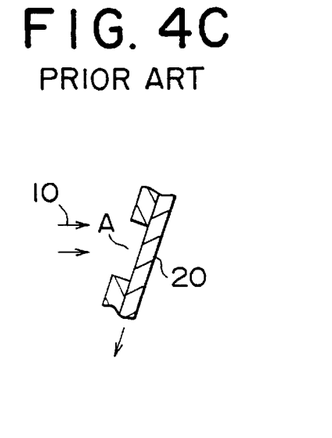
Figure 4D:
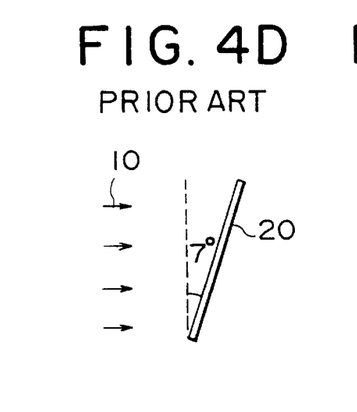
Figures 4E, 4F:
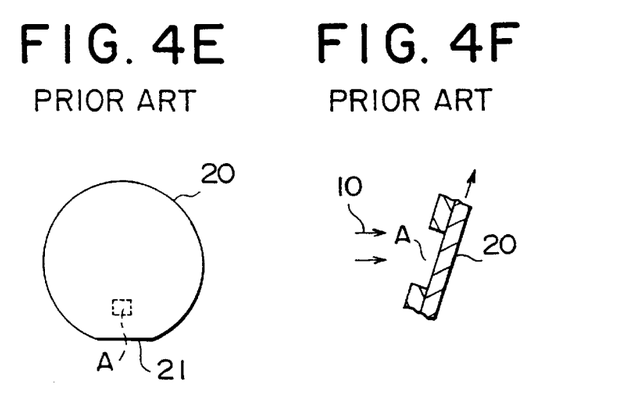

Patent Publication No. JP-A-1992-96367 discloses a solution of the problem caused by inclined implantation of ion beams, which will be described with reference to FIGS. 4A to 4F. FIGS. 4A, 4B and 4C show a side view of implantation process for a semiconductor wafer 20 having an area "A" for implantation, a front view thereof, and a cross-section thereof taken at the area "A", respectively, with the orientation flat 21 of the wafer 20 being upside. FIGS. 4D, 4E and 4F show the implantation similarly to FIGS. 4A, 4B and 4C, respectively, with the orientation flat 21 of the wafer 21 being downside. In these drawings, ions are implanted into the semiconductor wafer 20 for mask ROMs which is inclined by 7° with respect to the plane perpendicular to the ion beam 10. The semiconductor wafer 20 is rotated about the center of the wafer 20 during the implantation, to thereby avoid an offset of the implanted area "A". This solution is effective to assure that FETs designed to be normally ON are actually made ON.

However, the solution is not effective to eliminate the offset of the implanted area caused by deviation of the ions in the peripheral portion, which is associated by the raster scanning ion implanter. For example, in a raster scanning ion implanter using the solution, incident angles of ions are actually point-symmetric with respect to the center of the semiconductor wafer 20. That is, ions implanted in the semiconductor wafer 20 while rotating the wafer 20 about its center has an offset problem unsolved. As to the disc scanning ion implanter using the solution, incident angles of ions are axisymmetric with respect to the rotational direction of the semiconductor wafer. Accordingly, even when the semiconductor wafer is rotated on a rotating disc, the offset problem remains unsolved.

SUMMARY OF THE INVENTION

In view of the foregoing, an object of the present invention is to provide a method for manufacturing semiconductor devices on a semiconductor wafer, which is capable of reducing the offset problem in an ion implantation over the entire surface of a semiconductor wafer.

The present invention provides a method for manufacturing on a wafer a plurality of semiconductor devices having a common designed structure, the method including steps of grouping the semiconductor devices in a plurality of groups including a first group and a second group each including at least one semiconductor device, forming a photoresist pattern for each of the semiconductor devices, the photoresist pattern of each semiconductor device in the first group having a first opening deviated in a first direction from designed position for the first opening, and implanting an ion beam by using each photoresist pattern as a mask.

The steps of forming the photoresist pattern and implanting the ion beam are preferably executed for programming of a mask ROM by which impurity ions are implanted into channel regions of selected FETs so as to control the threshold voltage of the selected FETs.

Ions may be implanted at an acceleration energy of 300 keV or higher. The photoresist patterns is preferably shifted by using an alignment offset function of a reduction projection aligner. Specifically, semiconductor devices to be formed on a semiconductor wafer are grouped in a plurality of groups each including a plurality of or a single semiconductor device, and photoresist patterns formed on respective semiconductor devices in one of the groups have the same alignment offset among them or no alignment offset. When a raster scanning ion implanter is used to implement the method according to the present invention, the grouping of the semiconductor devices on a semiconductor is preferably effected in accordance with X-Y co-ordinates of the semiconductor devices on the wafer surface. The direction of the alignment offset for each group preferably has X- and Y-components. On the other hand, when a disc scanning ion implanter is used, the grouping of the semiconductor devices is preferably effected in accordance with the Y-ordinates of the semiconductor devices on the wafer. The alignment offsets of the semiconductor devices in each group is preferably effected in X-direction.

According to the method for manufacturing semiconductor devices of the present invention, if the ion implantation for programming of a mask ROM is to be performed using an ion implanter having different injection angles within the surface of a semiconductor wafer, the positions of openings in the photoresist patterns are corrected in advance for compensating an implantation offset caused by the different injections angles dependently on the portions of the wafer. In detail, openings in photoresist patterns are formed such that their positions are shifted from their designed positions to have alignment offsets in accordance with the injection angles at specific positions within the semiconductor wafer surface. Thus, in the ion implantation step, the implantation offset is compensated by the alignment offset to thereby implant the impurity ions accurately into designed regions.

Generally, in order to prevent the occurrence of a defect in semiconductor devices, a conventional method requires taking wider margins such as the larger spacing between an opening for writing data therethrough and a region for separating a device. By contrast, according to an aspect of the present invention, an implantation offset may be halved from that of the conventional method, thereby reducing the margins required. This allows higher integration of semiconductor devices.

The above and other objects, features and advantages of the present invention will be more apparent from the following description.

BRIEF DESCRIPTION OF THE DRAWINGS

FIG. 8A is a plan view of a semiconductor wafer for showing the division thereof for grouping of semiconductor devices while

FIG. 9A is a schematic side view of a typical reduction projection aligner used for implementing the method according to the present invention, while

FIG. 10A is a schematic side view of an implantation effected by a disc scanning ion implanter while FIG. 11A is a plan view of a semiconductor wafer for showing the division thereof for grouping of semiconductor devices while

DETAILED DESCRIPTION OF THE PREFERRED EMBODIMENTS

Before describing embodiments of the present invention, problems encountered by the conventional methods will be detailed below for the sake of understanding the present invention.

Figure 5:
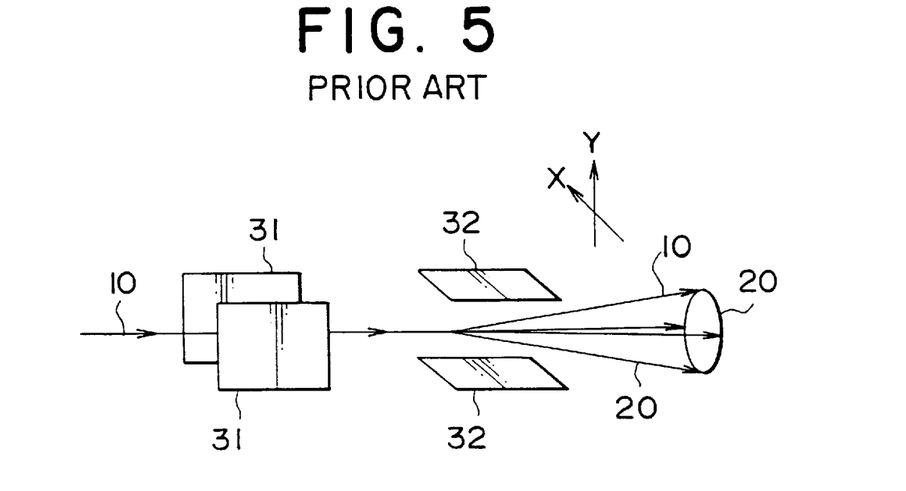
FIG. 5 is a schematic perspective view of a raster scanning ion implanter.

Referring to FIG. 5 which schematically show a typical implantation effected by a raster scanning ion implanter, an ion beam 10 emitted from an ion source is deflected by a pair of horizontal scanning electrodes 31 and a pair of vertical scanning electrodes 32, so as to scan the surface of a semiconductor wafer 20 fixed in an upright posture horizontally and vertically on the wafer surface. In this way, the ion beam 10 scans the entire surface of the wafer 20, which has, for example, a diameter of 6 inches.

Figure 6:
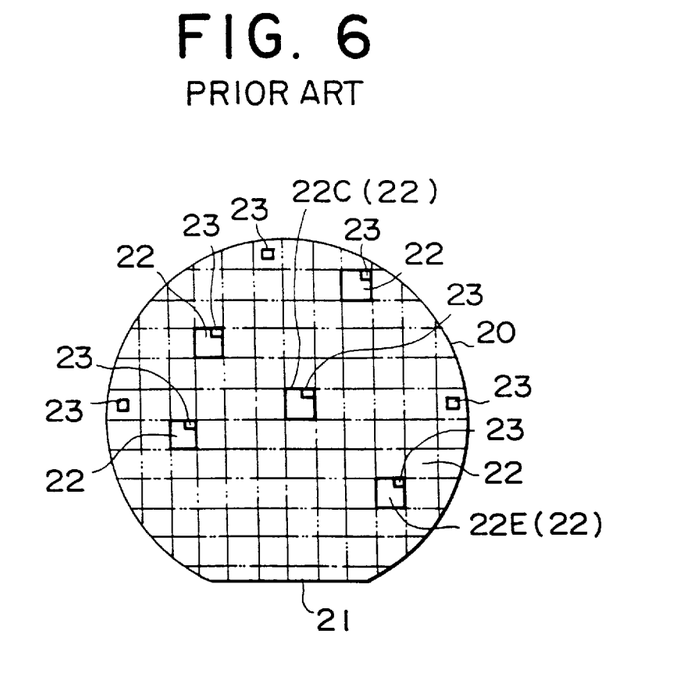
FIG. 6 is a plan view of a semiconductor wafer used for a method according to a first embodiment of the present invention.

Referring to FIG. 6 showing a plan view of a typical semiconductor wafer 20 which may be implanted by the raster scanning implanter of FIG. 5, the wafer 20 has an orientation flat 21 formed at a peripheral portion thereof and contains a plurality of semiconductor device (chip) regions thereon arranged in a matrix. The semiconductor wafer 20 is generally stocked before programming each of the memory cell transistors in the semiconductor chips 22. In the drawing, only five semiconductor chips are illustrated by a solid line while the remaining chips are schematically represented by chain lines. On the semiconductor wafer 20, the semiconductor chips 22 are half-fabricated for awaiting programming to have the same designed configuration and designed function. Numerous MOS transistor cells are formed in each semiconductor chip 22, and an alignment mark 23 is formed in each semiconductor chip 22 for identification of the location on the chip 22. Alignment marks 23 are also formed at peripheral portions of the semiconductor wafer 20 outside the chip 22 for identification of the chip 22.

After the programming data to be written in the semiconductor devices are received from a customer, photoresist patterns such as shown in FIG. 2 are formed on the semiconductor wafer 20 such that openings are formed at positions located above the channel regions of MOS transistors selected for programming. Impurity ions are then implanted into the channel regions of the selected MOS transistors by using the ion implanter such as shown in FIG. 5, thereby changing the threshold voltage of the selected MOS transistors for programming. Thus, mask ROMs are obtained which have NOR circuits, NAND circuits or the like formed in accordance with the ordered specification from the customer.

Since the layouts for MOS transistors are designed to be same among all of the semiconductor devices 22, mask ROMs having the same configuration and function may be obtained by using the same photoresist pattern for all of the semiconductor device, if the ion beam 10 perpendicularly impinges on the entire surface of the semiconductor wafer 20.

However, as will be understood from FIG. 5, in the raster scanning ion implanter, the ion beam 10 perpendicularly impinges on the central portion of the semiconductor wafer 20 while the ion beam 10 impinging on the peripheral portion thereof has a certain incident angle. Therefore, in the semiconductor wafer 20 of FIG. 6, for example, ions are properly implanted into the channel regions of MOS transistors in the semiconductor device 22C located at the central portion of the wafer 20, thereby accurately controlling the threshold voltage of the selected transistors to a predetermined level. On the other hand, ions are not properly implanted into the channel regions of selected MOS transistors in the semiconductor device 22E located at the peripheral portion of the wafer 20 due to the offset $L_{off}$ such as shown in FIG. 3, resulting in failure to accurately control the threshold voltage to the predetermined level. The present invention solves the problem as described above.

Now, embodiments of the present invention will be described with reference to the accompanying drawings. The method according to the first embodiment of the present invention uses a raster scanning ion implanter of FIG. 5 to scan wafer 20 of FIG. 6.

Figure 7A:
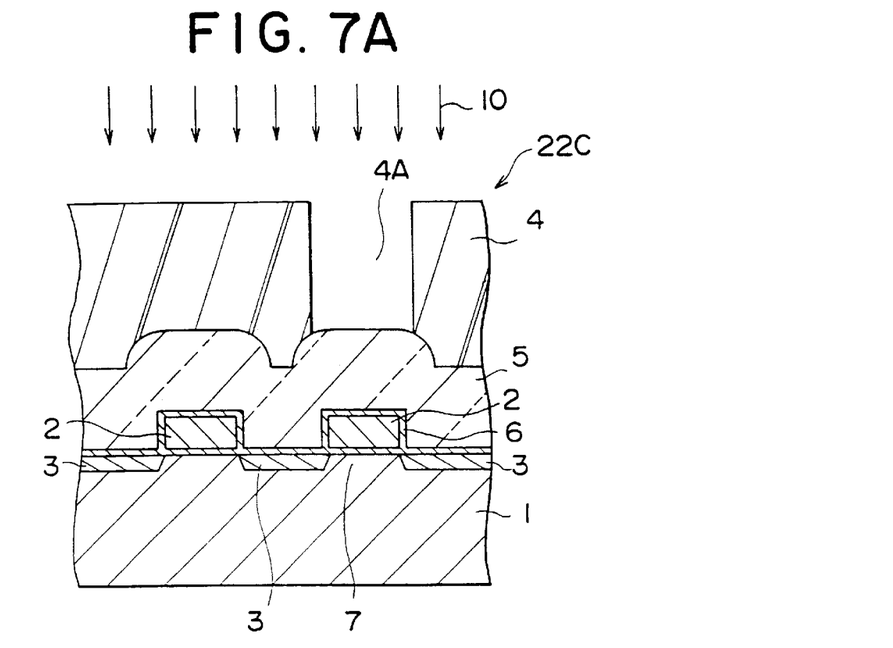
FIG. 7A is a cross-sectional view of a FET in a semiconductor device located at the central portion of a semiconductor wafer during a step of the method according to the first embodiment of the present invention.
Figure 7B:
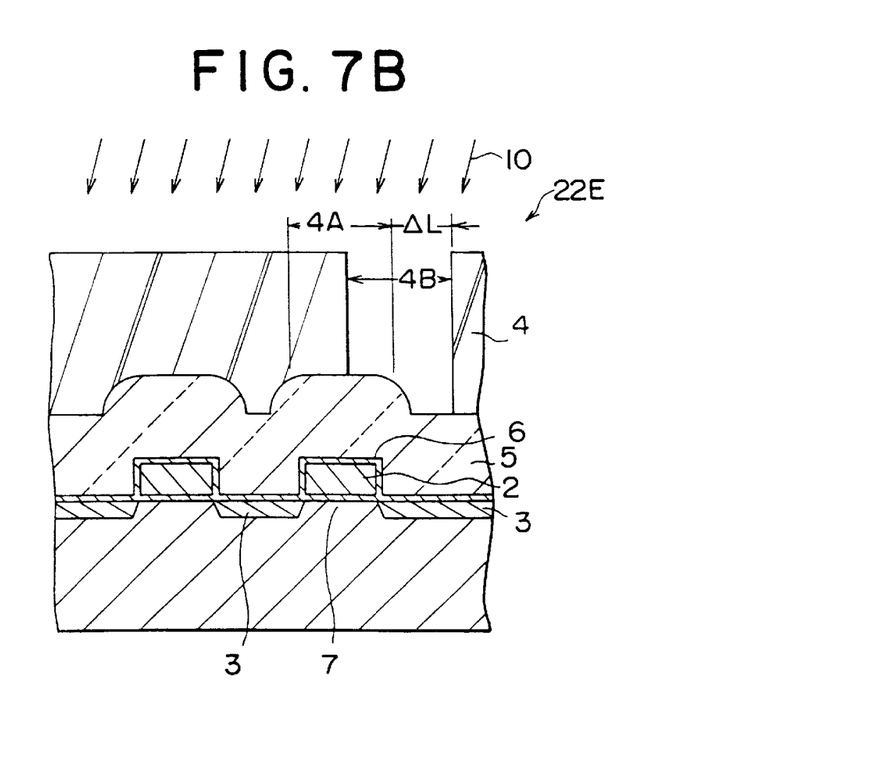
FIG. 7B is a cross-sectional view of a FET in another semiconductor device located at the peripheral portion of the semiconductor wafer including the semiconductor device of FIG. 7A.

Referring additionally to FIGS. 7A and 7B showing MOS transistors in semiconductor devices 22C and 22E located at the central portion and peripheral portion, respectively, of the semiconductor wafer 20 of FIG. 6, different photoresist patterns 4 are formed dependently on the locations where the semiconductor devices are located on the semiconductor wafer 20.

In FIGS. 7A and 7B, N-type source/drain regions 3 is formed on a p-type silicon substrate 1, a gate electrode 2 is formed above a channel region 7 with a gate insulating film disposed therebetween, and an interlayer insulating film 5 having a thickness of 1 μm is formed on the MOS transistor which is covered by a silicon oxide film 6. Contact holes (not shown) are formed in the silicon oxide film at desired positions to provide a half-product, which is stocked for subsequent programming.

In order to program the semiconductor device 22C of FIG. 7A located at the central portion of the semiconductor wafer, the photoresist pattern 4 having a film thickness of about 2 μm is formed such that an opening 4A formed therein is located just above the channel regions 7, considering the fact that the phosphorus ions ($^{31}P^+$) 10 impinge perpendicularly on the substrate surface. As a result, ions are implanted by a predetermined amount into the channel region 7 of this MOS transistor in the ion implantation step, whereby the threshold voltage is accurately adjusted to form a normally ON transistor.

In the semiconductor device 22E of FIG. 7B located at the peripheral portion of the semiconductor wafer, the photoresist pattern 4 having a film thickness of about 2 μm is formed such that an opening 4B formed therein is shifted by an offset $\Delta_L$ from the designed position of the opening for the channel region 7, which offset may be equal to $L_{off}$ in FIG. 3 associated with the injection angle of the ions. The offset amount $\Delta L$ is determined by considering that the phosphorus ions ($^{31}P^+$) 10 impinge on the substrate surface, at a certain angle with respect to the perpendicular of the substrate surface. That is, the opening 4B is shifted by offset $\Delta L$ from the designed position corresponding to the opening 4A in FIG. 7A. As a result, ions are also implanted by a predetermined amount into the channel region 7 of the MOS transistor, whereby the threshold voltage is accurately adjusted to form a normally ON transistor.

Photoresist patterns as formed above allow the impurity ions to be injected into designed regions for effecting accurate programming, irrespective of the locations where the semiconductor devices are located on a semiconductor wafer, i.e., irrespective of the central portion or peripheral portion thereof.

Next, a practical method for forming a photoresist pattern having an opening offset from the designed position will be described.

At present, typical photoresist patterns for performing programming of a mask ROMs are formed using a reduction projection aligner. The reduction projection aligner detects an alignment mark on each semiconductor device or the semiconductor wafer so as to perform an exposure without misalignment. Currently available reduction projection aligners allow an arbitrary alignment offset to be effected, which can be used for implementing photoresist pattern for use in the present invention.

Specifically, in the first embodiment of the present invention, semiconductor devices on a semiconductor wafer are grouped in a plurality of groups, and are subjected to exposure in a group by group fashion while an arbitrary alignment offset is assigned to each group, which is effected in the direction having X-component, Y-component or both X- and Y-components.

Figure 8A:
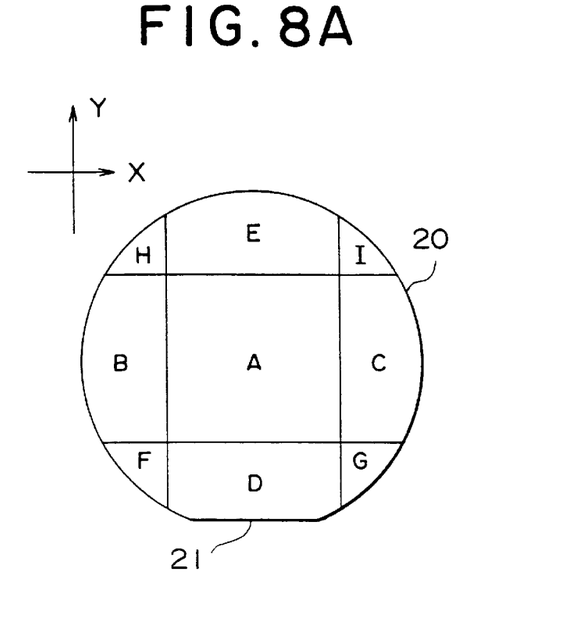
Figure 8B:
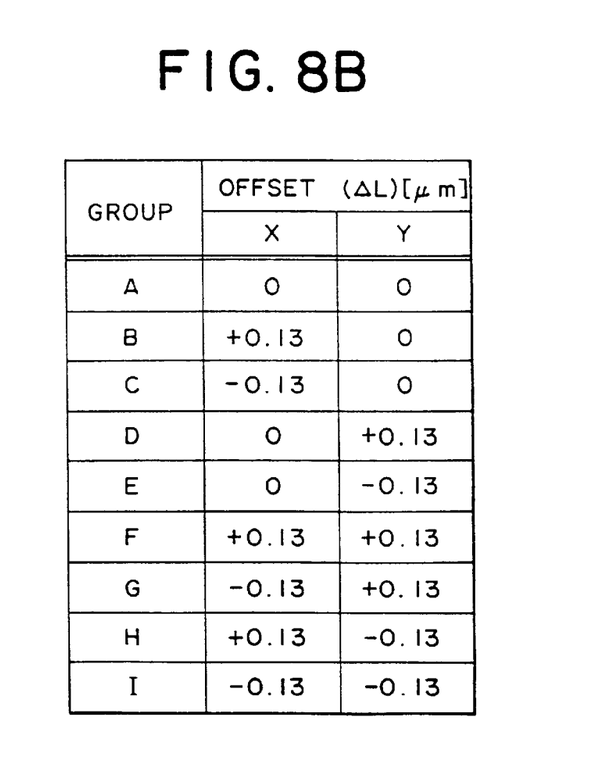
FIG. 8B is a table for showing an alignment offset for each group provided by the grouping of FIG. 8A.

FIG. 8A is a map of a semiconductor wafer including semiconductor devices grouped in accordance with alignment offsets to be effected during programming using a raster scanning high-energy ion implanter. In order to compensate angle deviations in an ion implantation, according to the present embodiment, semiconductor devices are grouped in nine groups "A" to "I" in FIG. 8A. FIG. 8B is an exemplified table for providing the alignment offset for each of the nine groups "A" to "I" in FIG. 8A during the programming.

In the raster scanning high-energy ion implanter, angle deviations generated by ion implantation take place substantially in a point-symmetry with respect to the center of the semiconductor wafer 20. Accordingly, the amount of the alignment offsets in the photoresist patterns should be provided for the nine groups in a point-symmetry with respect to the center of the wafer. Thus, photoresist patterns are formed in accordance with the point-symmetrical alignment offsets. This compensates implantation offsets which take place at the peripheral portions of the semiconductor wafer due to angle deviations during the ion implantation for programming of the memory cells.

Next, a method for determining the alignment offsets as described above will be described.

In the raster scanning ion implanter, a maximum implantation offset of, for example, 0.26 μm takes place at the peripheral portion of the semiconductor wafer 20 having a 6-inch diameter. The angle offset in ion implantation decreases as the ion beam moves toward the central portion of the semiconductor wafer 20.

In view of the above, an average alignment offset of 0.13 μm is assigned to photoresist patterns in semiconductor devices included in groups "B" to "I" in either X- or Y-direction or in a direction having both X- and Y-components. For example, group "B" and group "C" located in symmetry with respect to the center of the wafer 20 in X-direction have alignment offsets of +0.13 μm and −0.13 μm, respectively, in X-direction. Similarly, group "H" and group "G" located in symmetry with respect to the center of the wafer 20 in X- and Y-directions have offsets of +0.13 μm and −0.13 μm, respectively, in X-components and offsets of −0.13 μm and +0.13 μm, respectively, in Y-components.

These offsets can suppress or compensate the implantation offset within the semiconductor wafer surface down to at most 0.13 μm, provided that the boundary between central group "A" and one of the other groups "B" to "I" is located at the location apart from the wafer center by half the wafer radius. In the present embodiment, nine groups for alignment offsets are provided during the exposure. However, it is apparent that a larger number of groups will allow finer compensation.

Figure 9A:
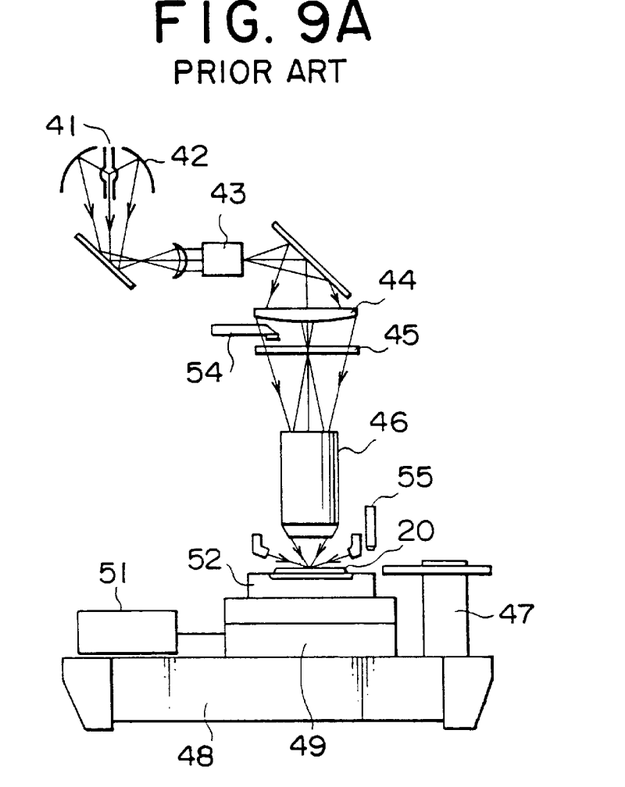
Figure 9B:
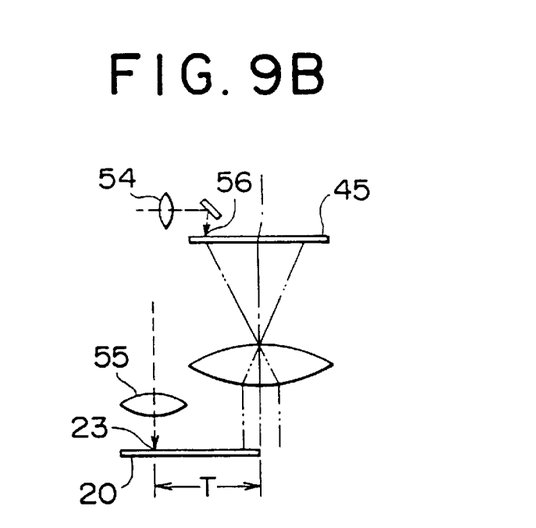
FIG. 9B is a schematic side view of detailed alignment effected for implementing the method according to embodiments of the present invention.

Referring to FIGS. 9A and 9B, a reduction projection aligner will be briefly described which can be used to expose the group "A" to "I" in FIG. 8A. Generally, the reduction projection aligner is operated as follows.

Exposure light emitted from an exposure light source 41 located within an elliptic mirror 42 travels along or through a half mirror, an integrator 43, a condenser lens 44, a reticle mask 45, and a reduction lens 46 and then selectively exposes a photoresist layer covering semiconductor devices in the semiconductor wafer 20, whereby after effecting development, the photoresist patterns having openings are obtained.

An X-Y stage 49 is mounted on a vibration isolating base 48, and a Z-θ table 52 is mounted on the X-Y stage 49. A semiconductor wafer 20 is loaded by a wafer loader 47 to be placed on the Z-θ table 52. A laser interferometric system 51 is provided for an accurate movement of the X-Y stage 49.

When alignment is to be established by an off-axis method, a mask mark 56 on a reticle mask 45 is detected by a reticle alignment system 54, and an alignment mark 23 on the semiconductor wafer 20 is detected by an off-axis alignment system 55. Based on these detections, a semiconductor device to be exposed is positioned apart by distance T from an exposed position through the reticle mask 45. Then, the X-Y stage 49 is moved by distance T to locate the semiconductor device just under the reticle mask 45, and then reduction projection exposure is effected.

Patterning of the photoresist 4 of FIGS. 7A and 7B can be effected by using the reduction projection aligner as described above. When semiconductor devices in group "A" are to be exposed, the X-Y stage 49 is moved by distance T in both X- and Y-directions. On the other hand, when semiconductor devices in groups "B" to "I" are to be exposed, the X-Y stage 49 is moved by a distance (T+0.13

μm) or (T−0.13 μm) in the X- or Y-direction or in both X- and Y-directions in accordance with a required alignment offset (ΔL) given in table of FIG. 8B, whereby exposure is carried out while effecting an alignment offset during the exposure. A quasi-TTL method and a TTL method can also provide the alignment offset during the exposure.

Ion implantation according to a second embodiment of the present invention uses a disc scanning high-energy ion implanter. In the present embodiment, it is determined that the alignment offset of MOS transistors of a semiconductor device located in the peripheral portion of a semiconductor wafer is similar to that of FIG. 7A, the configuration of the semiconductor wafer 20 is similar to that of FIG. 6, and photolithography of the resist pattern is implemented by the reduction projection aligner of FIG. 9A.

Figure 10A:
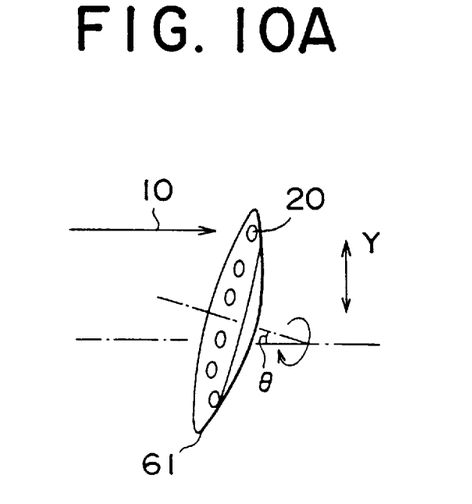

Referring to FIG. 10A showing ion implantation according to the second embodiment, the direction of an ion beam 10 emitted from an ion source is fixed. A plurality of 6-inch semiconductor wafers are fixed on the inner surface of a parabolic disc 61 having a diameter of 1 meter, for example. The orientation flat of each of the semiconductor wafers 20 is directed to the center of the disc 61. The disc 61 is rotated while its axis is inclined by angle θ (about 5 to 10 degrees) with respect to the direction of the ion beams, as was the case of the conventional method. The disc 61 is also reciprocally moved in Y-direction, i.e., in the vertical direction.

The angle θ is made identical to the inclination angle of the inner surface of the disc 61, to thereby set the main surface of the uppermost wafer 20, which is implanted by the ion beam 10 at present, to be directed in the vertical direction. By this configuration, the incident angle of the ion beam to the uppermost semiconductor wafer 20 remains unchanged in Y-direction, i.e. in the direction orthogonal to the orientation flat.

Figure 10B:
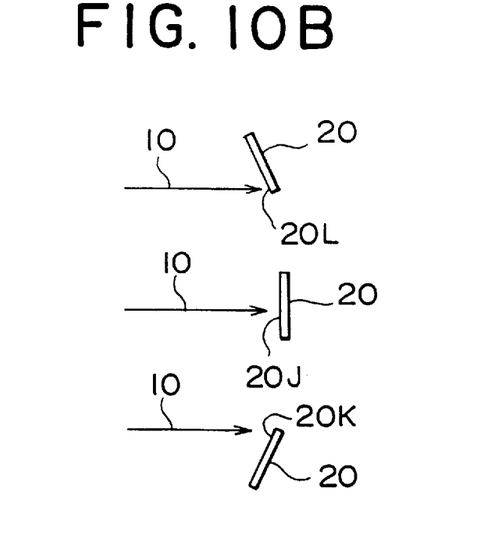
FIG. 10B is explanatory plan views for illustrating incident angle on a wafer surface of FIG. 10A.

Referring to FIG. 10B, there are show plan views of the ion implantation of FIG. 10A, which illustrate the uppermost semiconductor wafer 20 under implantation in slightly different three positions. As the disc 61 rotates, the ion beam 10 impinges on the semiconductor wafer 20 at the peripheral portion 20L thereof at a certain incident angle, next, the ion beam 10 perpendicularly impinges on the semiconductor wafer 20 at the central portion 20J, and finally the ion beam 10 impinges on the semiconductor wafer 20 at the peripheral portion 20K at an incident angle opposite to that at the peripheral portion 20L.

Figure 11A:
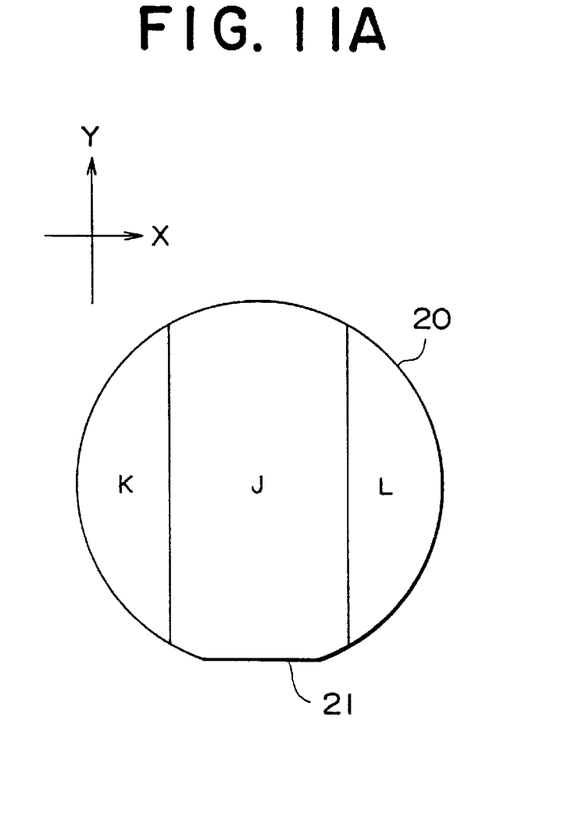
Figure 11B:
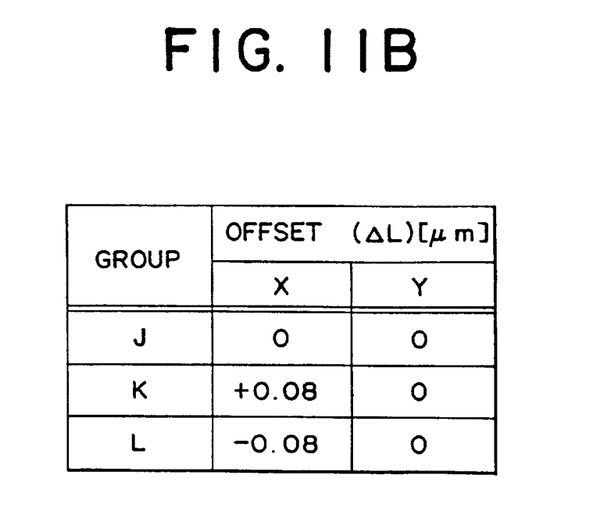
FIG. 11B is a table for showing an alignment offset for each group provided by the grouping of FIG. 11A.

FIGS. 11A and 11B show, similarly to FIGS. 8A and 8B, a map of grouping on the wafer and a table for alignment offsets, respectively. The map is adapted to the disc scanning high-energy ion implanter of FIG. 10A. In the disc scanning high-energy ion implanter, incident angle deviates substantially in symmetry with respect to the Y-axis passing the center of the semiconductor wafer 20. In order to compensate implantation offsets caused by the incident angle deviations, according to the present embodiment, alignment offsets are provided in symmetry with respect to the Y-axis in a group by group fashion.

The semiconductor chips on the wafer 20 are grouped in three groups including central group "J", left group "K" and right group "L". The group "K" and "L" have offsets of +0.08 and −0.08, respectively, in X-direction while have no offsets in Y-direction.

In the disc scanning ion implanter, a maximum incident angle deviation is approximately 3° which takes place at the peripheral portion of the wafer. When ion implantation is carried out by using the disc scanning ion implanter on a 6-inch semiconductor wafer having thereon a 2 μm-thick photoresist mask and a 1 gm-thick interlayer insulating film, the offset generated at the peripheral portion is about 0.16 μm. Accordingly, as shown in FIG. 11B, no alignment offset is assigned to the semiconductor devices in group "J" located at the central portion of the semiconductor wafer while an alignment offset of ±0.08 μm, which have an absolute value half the offset 0.16 μm, is assigned to the semiconductor devices in groups K and L in the X-direction. Accordingly, a maximum offset in the entire region of the semiconductor wafer is reduced down to 0.08 μm, i.e., half the original offset, as in the case of FIGS. 8A and 8B.

In the present embodiment, the alignment offsets are provided in only x-direction, which is obtained by using the disc scanning ion implanter. Accordingly, the photolithographic step for the present embodiment has a higher throughput because of the simple alignment offsets as compared to those of the first embodiment.

In the embodiments described above, the programming is effected for controlling the threshold of MOS transistors of a mask ROM. However, the present invention is applicable to controlling of any MOS transistors in other types of semiconductor devices in doping of the channels of the MOS transistors or doping of regions other than the channels of the MOS transistors.

Since above embodiments are described only for examples, the present invention is not limited to such embodiments and it will be obvious for those skilled in the art that various modifications or alterations can be easily made based on the above embodiments within the scope of the present invention.

What is claimed is:

1. A method for manufacturing on a wafer a plurality of semiconductor devices having a common designed structure, said method comprising the steps of:

grouping the semiconductor devices in a plurality of groups including a first group and a second group, each group including at least one semiconductor device, forming a photoresist pattern for each of the semiconductor devices, said photoresist pattern of each semiconductor device in said first group having a first opening deviated in a first direction from a designed position for said first opening, and implanting an ion beam by using said photoresist pattern as a mask.

2. A method as defined in claim 1 wherein said photoresist pattern of each semiconductor device in said second group has a second opening deviated from a designed position for said second opening in a second direction opposite to said first direction.

3. A method as defined in claim 1 wherein said photoresist pattern of each semiconductor device in said second group has a second opening at a designed position for said second opening.

4. A method as defined in claim 3 wherein said plurality of groups further include a third group, and said photoresist pattern of each semiconductor device in said third group has a third opening deviated from a designed position for said third opening in a second direction opposite to said first direction.

5. A method as defined in claim 4 wherein said first and second directions have respective X- and Y-components.

6. A method as defined in claim 5 wherein said X-component is parallel to an orientation flat of said semiconductor wafer.

7. A method as defined in claim 4 wherein said first and second directions are X-directions.

* * * * *